US010032728B2

(12) United States Patent
Wang et al.

(10) Patent No.: US 10,032,728 B2
(45) Date of Patent: Jul. 24, 2018

(54) TRENCH MOSFET DEVICE AND THE PREPARATION METHOD THEREOF

(71) Applicant: Alpha and Omega Semiconductor Incorporated, Sunnyvale, CA (US)

(72) Inventors: Xiaobin Wang, San Jose, CA (US); Madhur Bobde, Sunnyvale, CA (US); Paul Thorup, Hillsboro, OR (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/197,780

(22) Filed: Jun. 30, 2016

(65) Prior Publication Data
US 2018/0005959 A1    Jan. 4, 2018

(51) Int. Cl.
*H01L 29/78*    (2006.01)
*H01L 23/00*    (2006.01)
*H01L 29/06*    (2006.01)
*H01L 29/10*    (2006.01)
*H01L 29/40*    (2006.01)
(Continued)

(52) U.S. Cl.
CPC .......... *H01L 23/562* (2013.01); *H01L 21/265* (2013.01); *H01L 29/0696* (2013.01); *H01L 29/1095* (2013.01); *H01L 29/407* (2013.01); *H01L 29/66734* (2013.01); *H01L 29/7811* (2013.01); *H01L 29/7813* (2013.01)

(58) Field of Classification Search
CPC ........... H01L 29/0626; H01L 29/66734; H01L 29/4236; H01L 29/7811; H01L 29/7813; H01L 21/31144; H01L 29/7827; H01L 29/66666; H01L 29/407; H01L 27/088; H01L 29/42336; H01L 29/42352; H01L 29/66704
See application file for complete search history.

(56) References Cited
U.S. PATENT DOCUMENTS

2006/0118864 A1* 6/2006 Hirler .................. H01L 29/0878
257/335
2007/0155104 A1* 7/2007 Marchant .............. H01L 29/407
438/270
(Continued)

FOREIGN PATENT DOCUMENTS

TW    200919703 A    5/2009

*Primary Examiner* — Bitew Dinke
(74) *Attorney, Agent, or Firm* — Chen-Chi Lin

(57) ABSTRACT

A trench-type metal-oxide-semiconductor field-effect transistor (MOSFET) device and a fabrication method are disclosed. The trench MOSFET device comprises a semiconductor substrate of a first conductivity type. The semiconductor substrate has a plurality of first trenches arranged side by side in a first preset area of the semiconductor substrate extending along a first direction and a plurality of second trenches arranged side by side in a second preset area of the semiconductor substrate extending along a second direction perpendicular to the first direction. A control gate is formed in each of the pluralities of first and second trenches. A body region of a second conductivity type is formed at a top portion of the semiconductor substrate near sidewalls of the pluralities of first and second trenches. A source region of the first conductivity type is formed on a top portion of the body region.

18 Claims, 15 Drawing Sheets

(51) Int. Cl.
*H01L 29/66* (2006.01)
*H01L 21/265* (2006.01)

(56) References Cited

U.S. PATENT DOCUMENTS

| | | | | |
|---|---|---|---|---|
| 2010/0123188 A1* | 5/2010 | Venkatraman | ........ | H01L 29/407 257/330 |
| 2010/0123193 A1* | 5/2010 | Burke | ................... | H01L 27/088 257/334 |
| 2010/0123220 A1* | 5/2010 | Burke | ................... | H01L 29/407 257/630 |
| 2010/0140697 A1* | 6/2010 | Yedinak | ............. | H01L 29/0692 257/334 |
| 2010/0301410 A1* | 12/2010 | Hirler | ................ | H01L 29/7813 257/334 |
| 2011/0039383 A1* | 2/2011 | Chen | ..................... | H01L 29/407 438/270 |
| 2011/0136310 A1* | 6/2011 | Grivna | ................. | H01L 29/407 438/270 |
| 2012/0025874 A1* | 2/2012 | Saikaku | ............. | H01L 29/1095 327/109 |
| 2013/0043527 A1* | 2/2013 | Lui | ...................... | H01L 29/407 257/330 |
| 2013/0313638 A1* | 11/2013 | Yoshimochi | ........ | H01L 21/8232 257/334 |
| 2014/0061746 A1 | 3/2014 | Cho et al. | | |
| 2014/0084363 A1* | 3/2014 | Pearse | ................... | H01L 29/407 257/330 |
| 2014/0097431 A1* | 4/2014 | Zundel | ................... | H01L 22/14 257/48 |
| 2014/0175541 A1* | 6/2014 | Matri' | ................. | H01L 29/4238 257/334 |
| 2014/0217495 A1* | 8/2014 | Wutte | ................... | H01L 29/407 257/328 |
| 2014/0264577 A1* | 9/2014 | Rieger | ............... | H01L 27/0629 257/337 |
| 2016/0043168 A1* | 2/2016 | Ding | ................... | H01L 29/0626 257/328 |
| 2016/0043192 A1* | 2/2016 | Ding | ................... | H01L 29/4236 257/330 |
| 2016/0351668 A1* | 12/2016 | Schwetlick | ....... | H01L 29/42368 |
| 2016/0351702 A1* | 12/2016 | Numabe | ............. | H01L 29/7813 |

* cited by examiner

TRENCH MOSFET DEVICE AND THE PREPARATION METHOD THEREOF

FIELD OF THE INVENTION

This invention relates generally to a metal-oxide-semiconductor field-effect transistor (MOSFET) device. More particularly, the present invention relates to a trench MOSFET device and a method of fabricating the trench MOSFET device. During fabrication processes, the trench MOSFET device minimizes wafer warpage. High density deep trench MOSFET devices may be formed on the wafer.

BACKGROUND OF THE INVENTION

Power MOSFETs have been widely used in electronic devices due to fast switching speed, frequency performance, high input impedance, low driving power, and excellent temperature characteristics. A common trench-type power MOSFET device comprises a plurality of basic MOSFET cells. The space between the basic MOSFET cells has direct impact on the major parameters of power MOSFET including Drain-Source On-state Resistance ($R_{DS}$(ON)). $R_{DS}$(ON) is the total resistance of a unit area of the device between drain and source when the device is at on-state. $R_{DS}$(ON) is an important factor for determining the maximum rated current and power loss of the device. A semiconductor wafer to fabricate trench MOSFETs is easily warped. When deep trench MOSFETs with high density are prepared on the semiconductor wafer, wafer warpage leads to a low product yield. This invention discloses solutions to reduce the semiconductor wafer warpage.

SUMMARY OF THE INVENTION

A trench-type metal-oxide-semiconductor field-effect transistor (MOSFET) device and a fabrication method are disclosed. The trench MOSFET device comprises a semiconductor substrate of a first conductivity type. The semiconductor substrate has a plurality of first trenches arranged side by side in a first preset area of the semiconductor substrate extending along a first direction and a plurality of second trenches arranged side by side in a second preset area of the semiconductor substrate extending along a second direction perpendicular to the first direction. A control gate is formed in each of the pluralities of first and second trenches. A body region of a second conductivity type is formed at a top portion of the semiconductor substrate near sidewalls of the pluralities of first and second trenches. A source region of the first conductivity type is formed on a top portion of the body region.

BRIEF DESCRIPTIONS OF THE DRAWINGS

DETAILED DESCRIPTION OF THE INVENTION

Figure 1A:
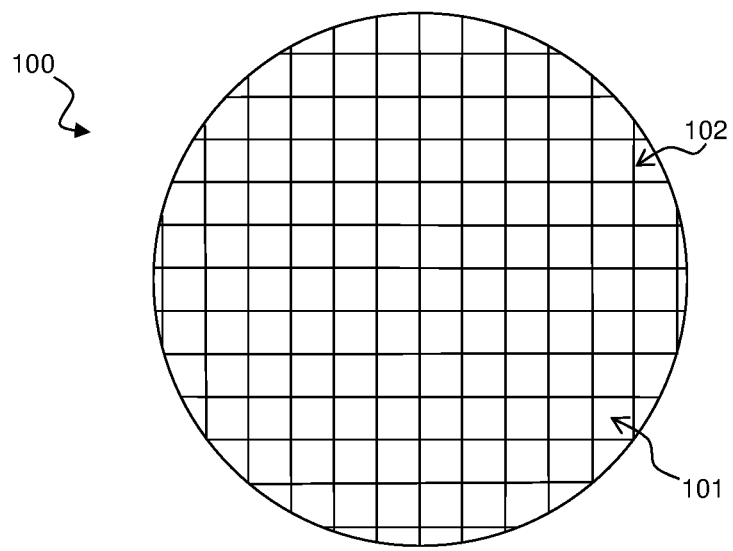
FIGS. 1A-1B are schematic diagrams illustrating a top view of a wafer including a plurality of semiconductor chips and a top view of a stripe layout of a single trench MOSFET chip respectively in examples of the present disclosure.
Figure 1B:
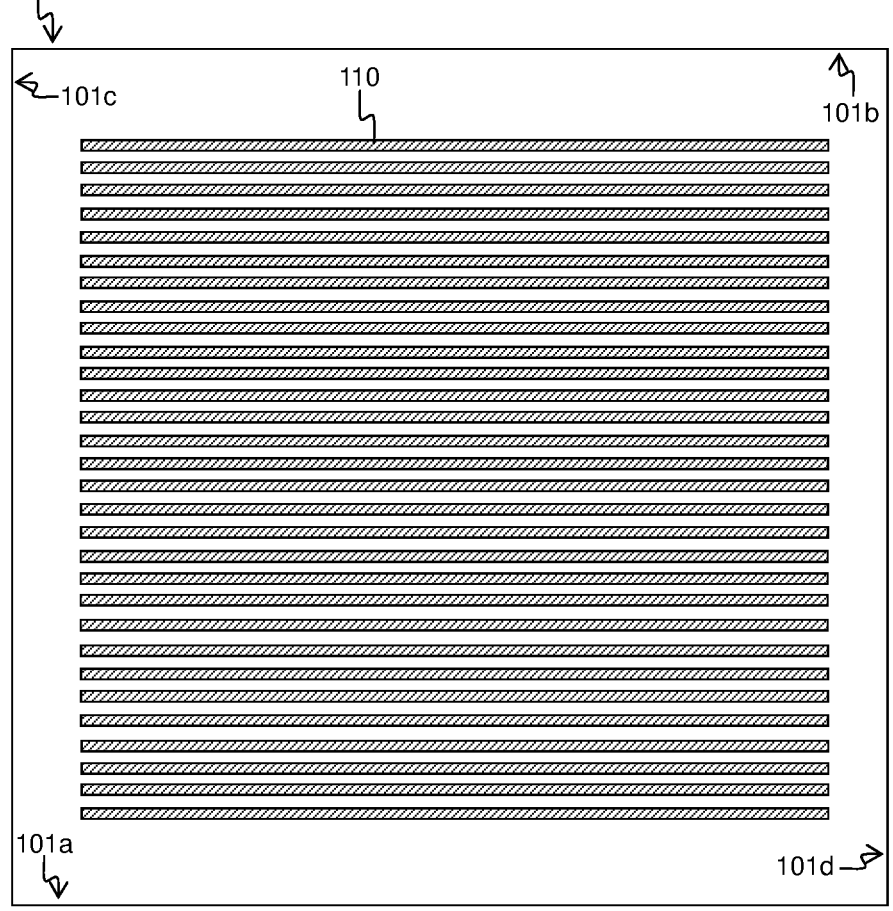

As shown in FIG. 1A, a semiconductor wafer 100 comprises a plurality of semiconductor chips 101 with the scribe lines 102 defining the boundaries between adjacent chips 101. The chips 101 can be cut off and be separated from the wafer 100 along the scribe lines 102 in a subsequent stage, for example, in a packaging stage. FIG. 1B is a top view of a separated chip 101. The separated chip 101 has a stripe cell layout of a traditional trench MOSFET including several trenches 110 filled with conductive material to form the gate of the MOSFETs. In examples of the present disclosure, FIG. 1B shows a square chip 101 having a pair of transversely parallel opposite sides 101a and 101b and a pair of vertically parallel opposite sides 101c and 101d. The trenches 110 are arranged on the chip 101 parallel to sides 101a and 101b. The active semiconductor mesa defined by adjacent parallel trenches 110 extends continuously in a direction parallel to a longitudinal direction of the trenches 110 to a much longer length compared to a width of the active semiconductor mesa that is defined by a spacing between adjacent parallel trenches 110. The active semiconductor mesa in stripe layout has a length in a direction parallel to the longitudinal direction of the trenches that is more than 10 times larger than a width in a direction perpendicular to the longitudinal direction of the trenches.

Figure 2:
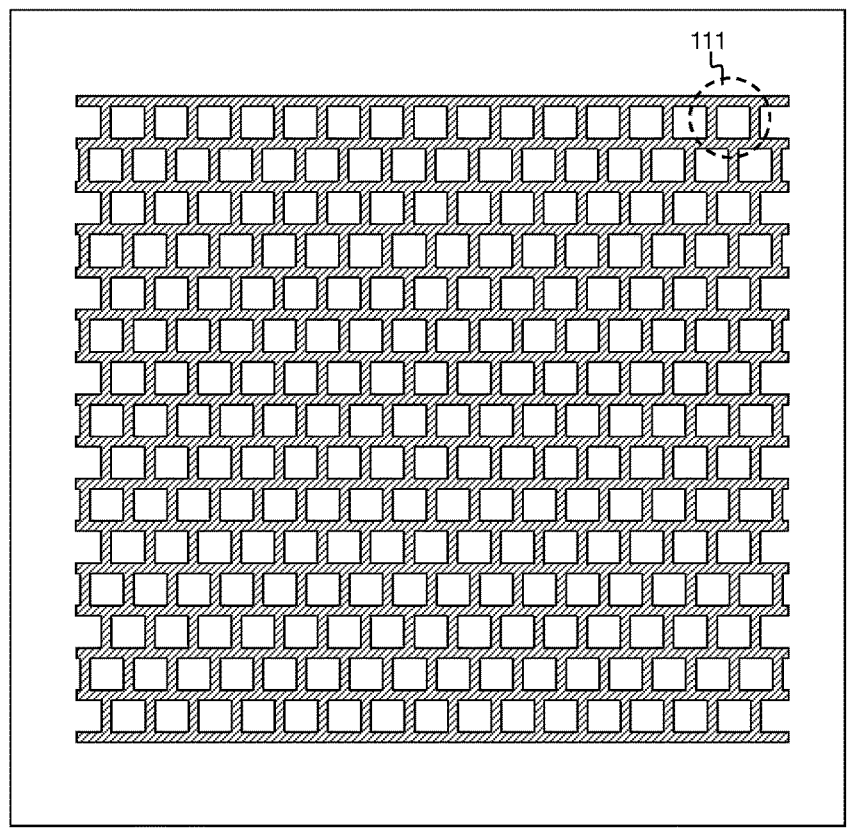
FIG. 2 is a top view of a closed cell layout for a trench MOSFET chip in examples of the present disclosure.

FIG. 2 shows a closed cell layout of a traditional trench MOSFET. It includes a plurality of closed cell trench MOSFETs 111. A plurality of vertical trenches are arranged between each set of two adjacent transverse trenches. The active semiconductor mesa defined by two adjacent vertical trenches and two adjacent transverse trenches has a length over width ratio not more than 5. The closed cell trench MOSFET 111 partially reduces wafer stress and thus reduces the wafer warpage. For both transverse and vertical trenches, keeping pre-determined distances between the adjacent trenches are critical. For deeper and wider trench MOSFET, the requirement of the trench density and the requirement of the on-state resistance for the closed cells are often not satisfied at the same time.

Figure 3A:
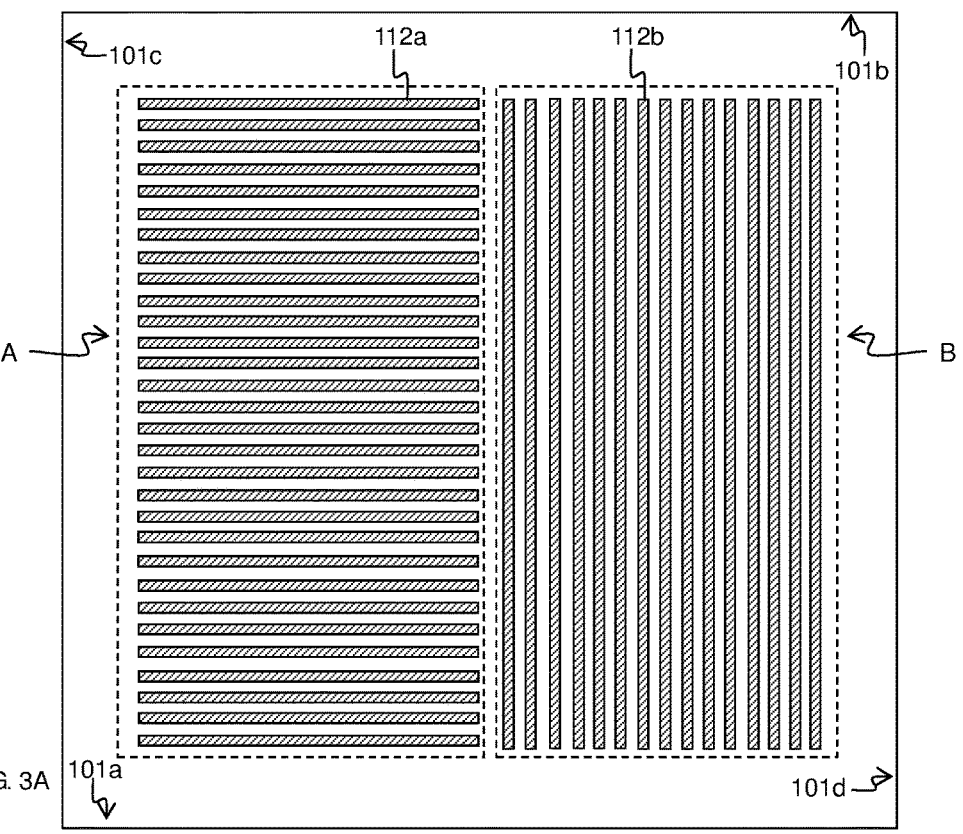
FIGS. 3A-3C are top views of alternative stripe layouts of first and second trenches formed on a trench MOSFET chip in examples of the present disclosure.

FIG. 3A is a top view of a trench MOSFET chip 101. The trench MOSFET chip 101 includes a plurality of first trenches 112a arranged on a first preset area A of the trench MOSFET chip 101 on the semiconductor substrate. A first stripe layout extends along a first direction parallel to the pair of opposite sides 101a and 101b of the trench MOSFET chip 101. The trench MOSFET chip 101 further includes a plurality of second trenches 112b arranged on the second preset area B of MOSFET chip 101 on the semiconductor substrate. A second strip layout extends along a second direction parallel to the pair of opposite sides 101c and 101d of the trench MOSFET chip 101. For example, in a Cartesian coordinate system, the first direction is the X direction, the second direction is the Y direction and the depth direction of the first and the second trenches 112a and 112b is the Z direction.

In the first preset area A of the trench MOSFET chip 101, the active semiconductor mesa defined by adjacent first trenches 112a extends continuously in the direction parallel to a longitudinal direction of the first trenches 112a to a much longer length compared to a width of the mesa that is defined by the spacing between adjacent first trenches 112a. The active semiconductor mesa in the first preset area A has a length in the direction parallel to the longitudinal direction of the first trenches 112a that is more than 10 times larger than the width in the direction perpendicular to the longitudinal direction of the first trenches 112a. In the second preset area B of the trench MOSFET chip 101, the active semiconductor mesa defined by adjacent second trenches 112b extends continuously in a direction parallel to a longitudinal direction of the second trenches 112b to a much longer length compared to a width of the mesa that is defined by the spacing between adjacent second trenches 112b. The active semiconductor mesa in the second preset area B has a length in a direction parallel to the longitudinal direction of the second trenches 112b that is more than 10 times larger than the width in a direction perpendicular to the second trenches 112b.

Figure 3B:
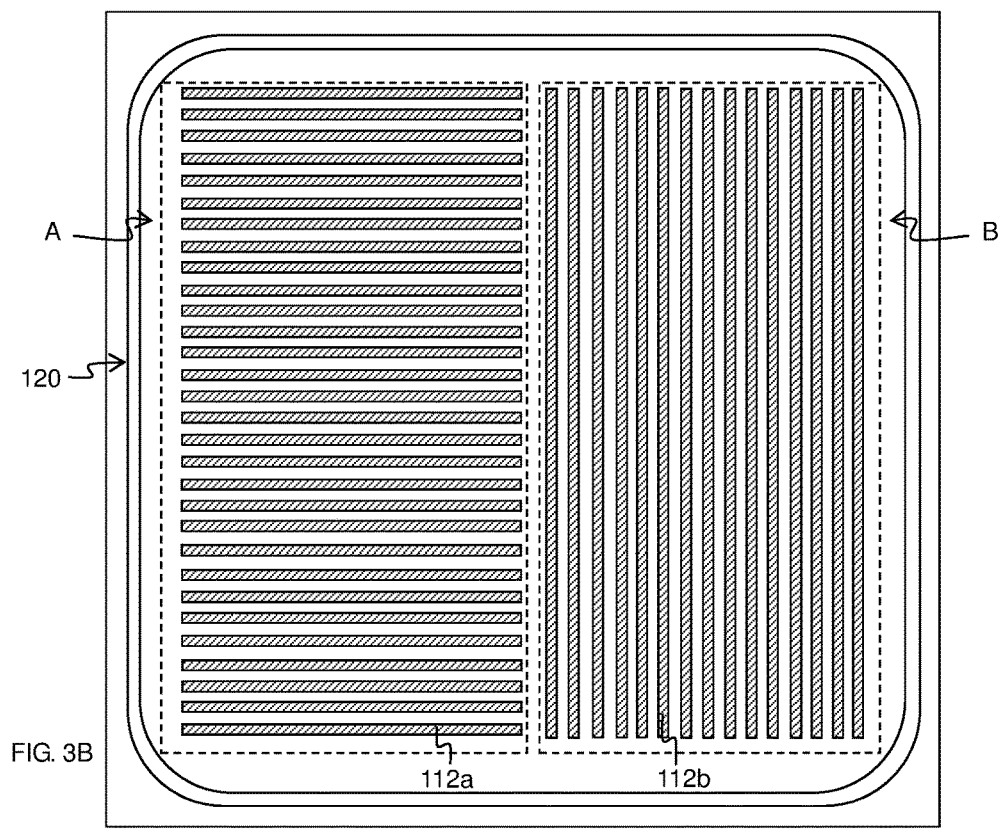

FIG. 3B is a top view of a trench MOSFET chip similar to that in FIG. 3A. A closed termination trench 120 of FIG. 3B is located near a peripheral of the chip 101. The plurality of first trenches 112a and the plurality of second trenches 112b arranged in the first preset area A and the second preset area B of the active area are in the closed termination trench 120.

Figure 3C:
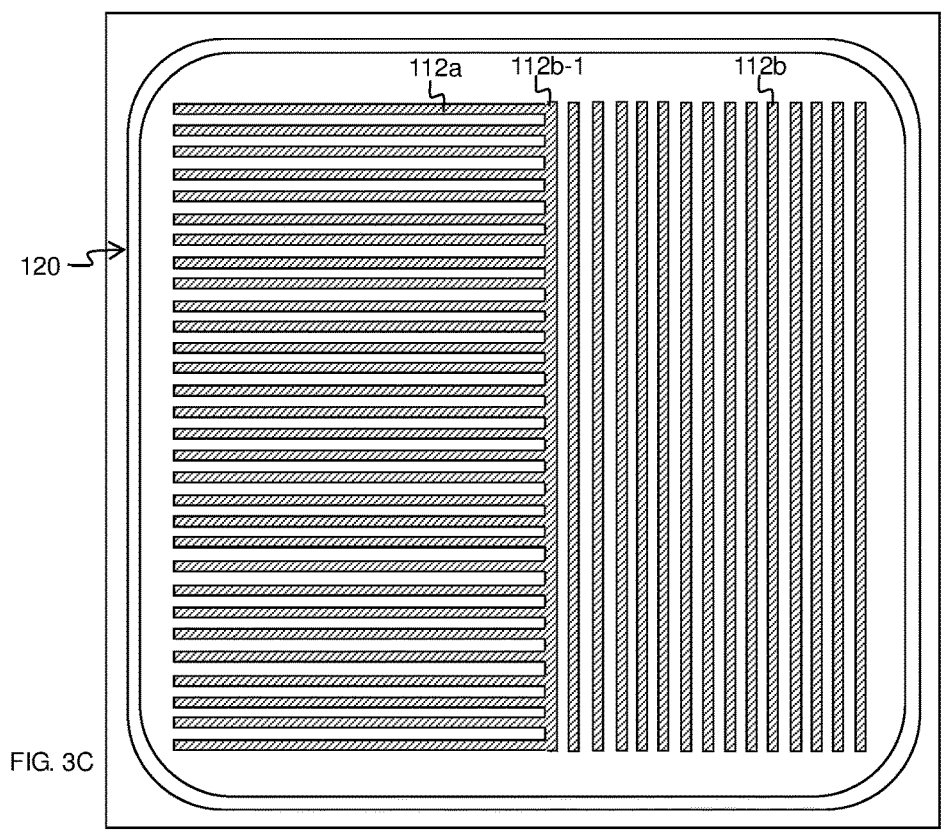

FIG. 3C is a top view of a trench MOSFET chip similar to that in FIG. 3B. A selected second trench 112b-1, located at the edge of the second preset area B and closest to the first preset area A, is connected to one end of each of the plurality of first trenches 112a in the first preset area A.

Figure 4A:
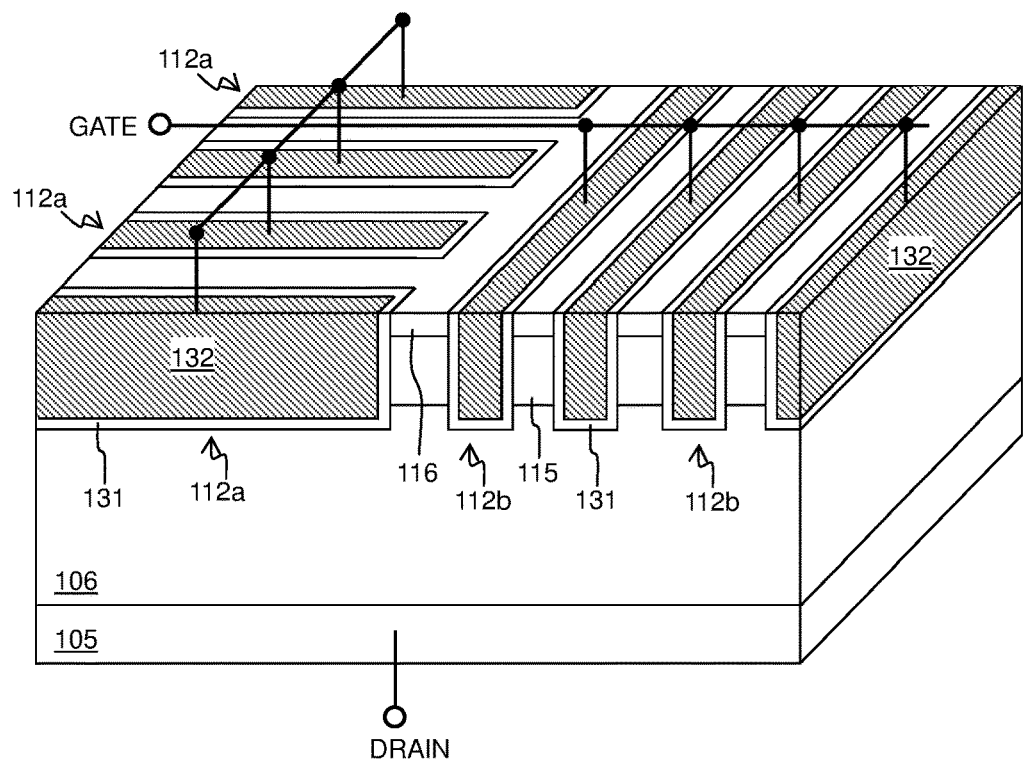
FIGS. 4A-4B are alternatively perspective views showing the first and the second trenches simultaneously formed on the trench MOSFET chip on a wafer in examples of the present disclosure.
Figure 4B:
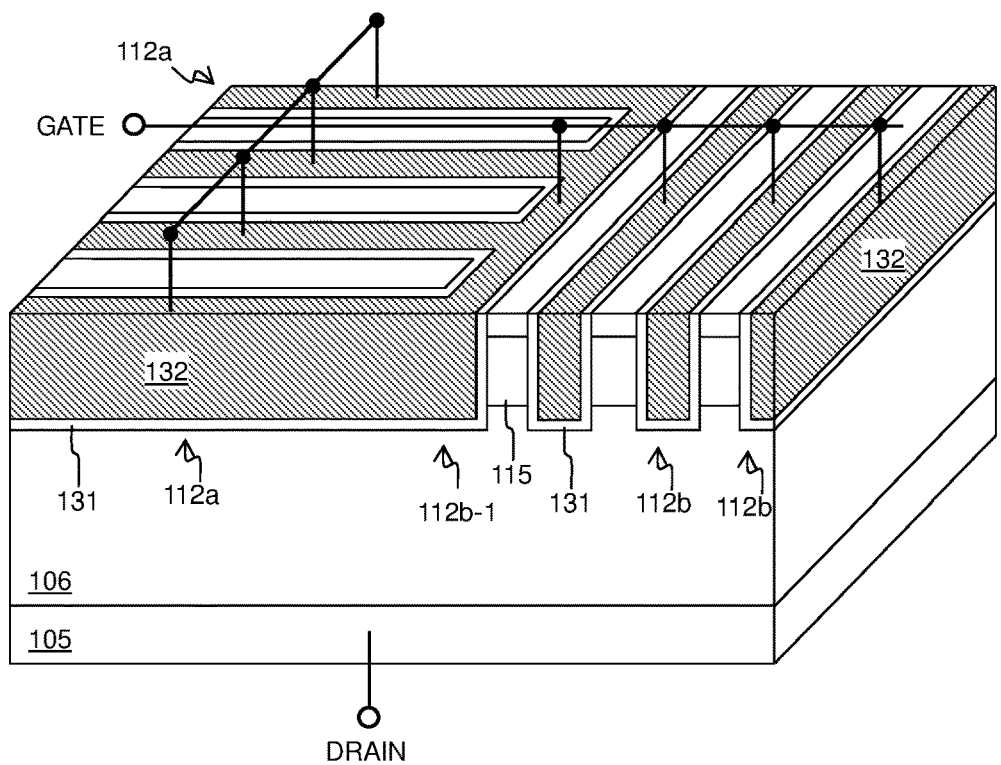

FIG. 4A and FIG. 4B are perspective views of the MOSFET chips in FIG. 3A and FIG. 3C with the gate connection respectively. In the example shown in these figures, the semiconductor substrate is made of a first conductivity type (for example, N-type) including a heavily N++ doped bottom layer 105 and an N-type epitaxial layer 106 attached to a top surface of the bottom layer 105. A body region 115 of a second conductivity type (for example, P-type) is implanted on a top portion of the N-type epitaxial layer 106. An N+ source region 116 is implanted on a top portion of the body region 115. The plurality of first trenches 112a and the plurality of second trenches 112b are formed on the semiconductor wafer penetrating through the source region 116 and the body region 115 and extending into the epitaxial layer 106 so as to form a plurality of mesas between adjacent trenches. The plurality of first trenches 112a and the plurality of second trenches 112b are all filled with a conductive material 132 with a thin insulation layer 131 lined on the internal walls and bottoms of the plurality of first trenches 112a and the plurality of second trenches 112b to electrically isolate the conductive material 132 from the semiconductor substrate.

When the MOSFET chip is in operation, a conducting channel is formed in a vertical direction in the body region 115 along the vertical walls of the plurality of first trenches 112a and the plurality of second trenches 112b. It forms a current channel between the drain region formed at the bottom layer 105 and the source region 116. In FIG. 4A, the plurality of first trenches 112a in the first preset area A is not connected to a selected second trench 112b in the second preset area B and is closest to the first preset area A. In FIG. 4B, one end of the plurality of first trenches 112a in the first preset area A extending to the second preset area B is connected to a selected second trench 112b-1 in the second preset area B and is closest to the first preset area A. The conductive material 132 in the plurality of first trenches 112a is electrically connected to the conductive material 132 in the selected second trench 112b-1 so as to reduce the gate resistance.

Figure 5:
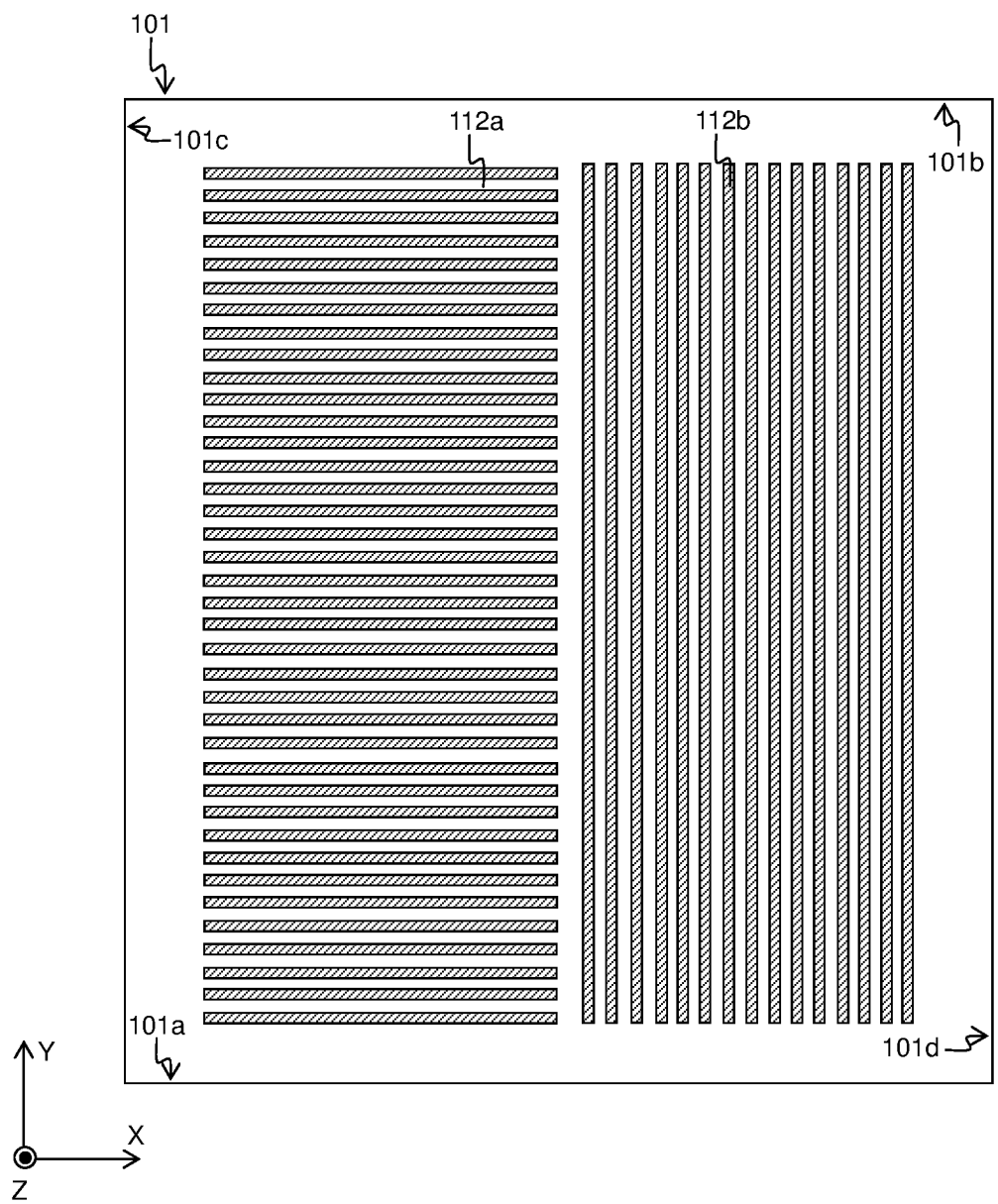
FIG. 5 is a top view of the trench MOSFETs with the stripe layout of on a rectangular trench MOSFET chip in examples of the present disclosure.

FIG. 5 is a top view of a rectangular, not square, trench MOSFET chip with the pluralities of first and second trenches 112a and 112b extending along the X-axis and the Y-axis in a Cartesian coordinate system respectively. The depth direction of the pluralities of first and second trenches 112a and 112b is the Z direction. In one example, a longitudinal direction of the plurality of first trenches 112a is parallel to the pair of short sides 101a and 101b of the chip 101. A longitudinal direction of the plurality of second trenches 112b is parallel to the pair of long sides 101c and 101d of the chip 101. In another example, the longitudinal direction of the plurality of first trenches 112a is parallel to the pair of long sides 101c and 101d of the chip 101. The longitudinal direction of the plurality of second trenches 112b is parallel to the pair of short sides 101a and 101b of the chip 101 (not shown).

Figure 6A:
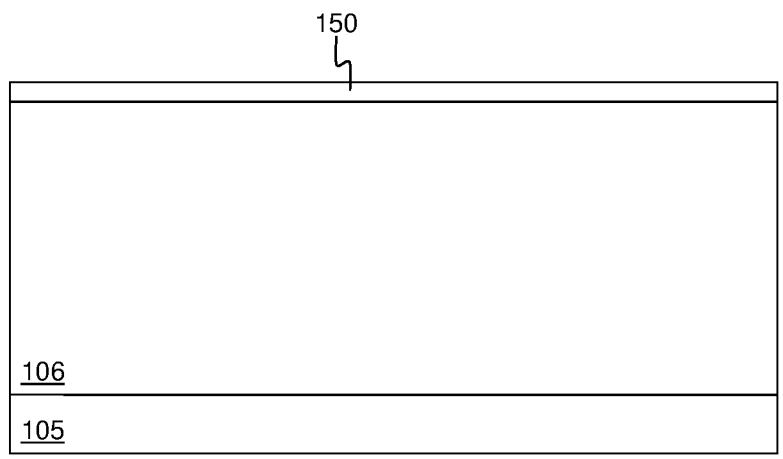
FIGS. 6A-6I are cross-sectional views showing a preparation method for a trench MOSFET chip with a stripe layout without a shield gate in examples of the present disclosure.
Figure 6B:
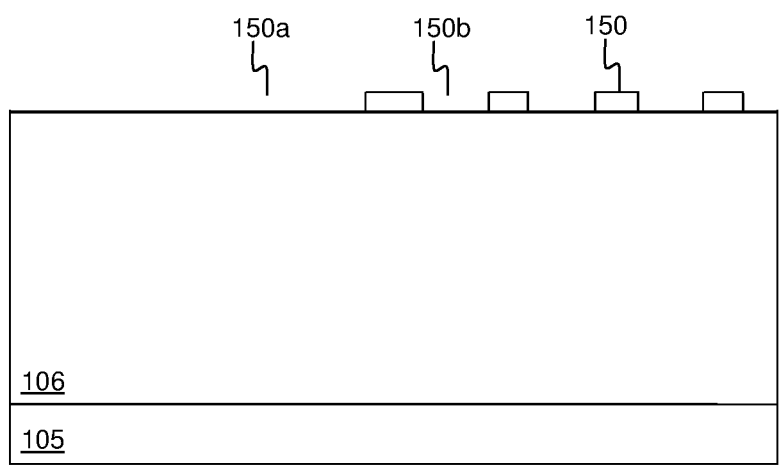
Figure 6C:
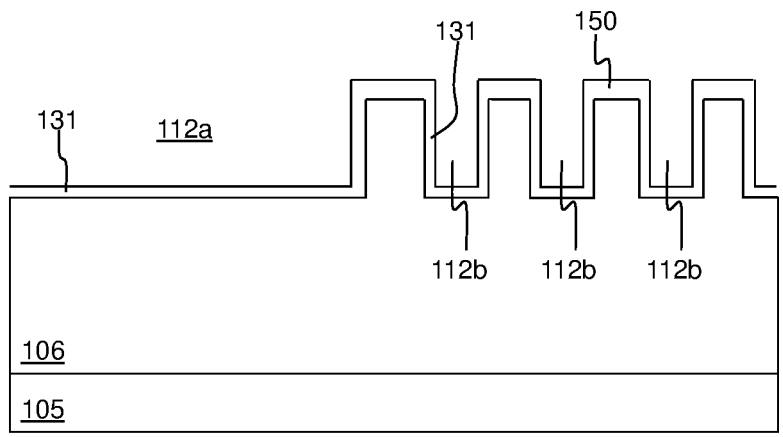

FIGS. 6A-6I are cross-sectional schematic diagrams illustrating a preparation process of fabricating the trench MOSFET chip shown in FIG. 4A. As shown in FIG. 6A, a mask layer 150, which can be a single or multiple layer structure, is formed on the semiconductor substrate. As shown in FIG. 6B, the mask layer 150 is patterned by photolithography and is etched to form a plurality of openings 150a and 150b to be used for defining the stripe trenches. Patterned mask layer 150 is then used as an etching mask to etch a top portion of the epitaxial layer 106 of the semiconductor substrate through the openings 150a and 150b to form the plurality of first trenches 112a and the plurality of second trenches 112b in the epitaxial layer 106 respectively. As shown in FIG. 6C, the extending direction of the plurality of first trenches 112a is perpendicular to the extending direction of the plurality of second trenches 112b. The first insulation layer 131 is formed at sidewalls and bottom surfaces of the plurality of first trenches 112a and the plurality of second trenches 112b.

Figure 6D:
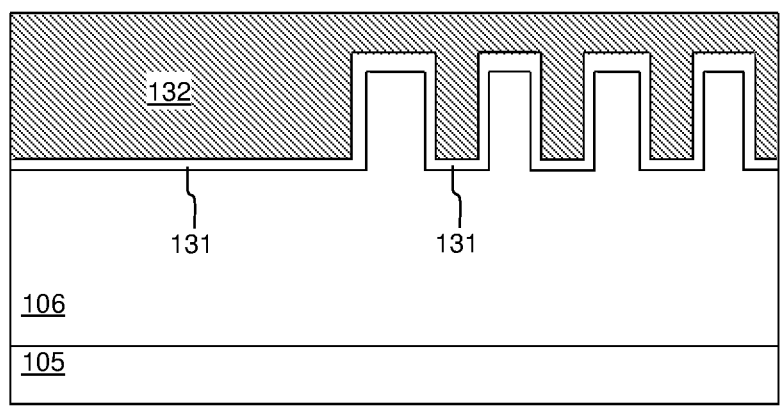
Figure 6E:
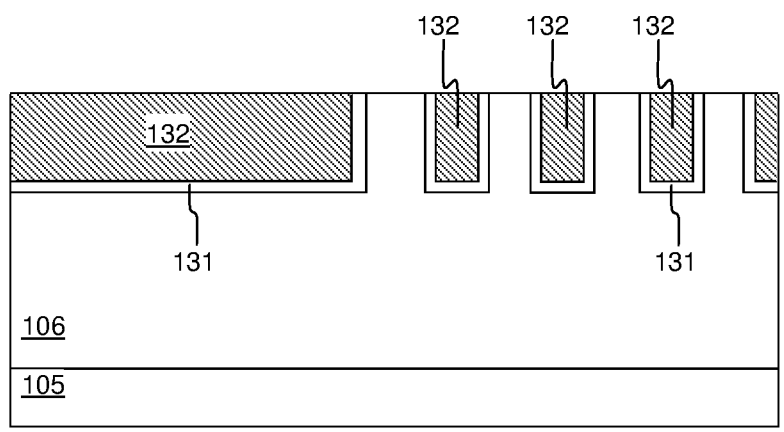

In FIG. 6D, the conductive material 132 is deposited. The conductive material 132 fills the plurality of first trenches 112a and the plurality of second trenches 112b and covers top of the mask layer 150. The conductive material 132 covering top of the mask layer 150 is then etched away, for example, by a dry etch. The mask layer 150 is then removed as shown in FIG. 6E. The conductive material 132 are retained in the plurality of first trenches 112a and the plurality of second trenches 112b and forms a respective control gate of each trench MOSFET.

Figure 6F:
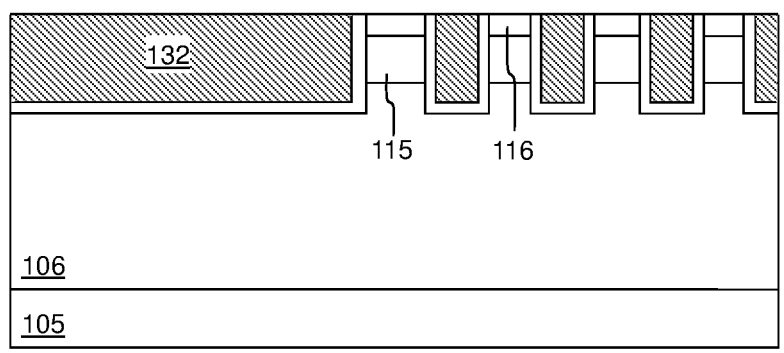
Figure 6G:
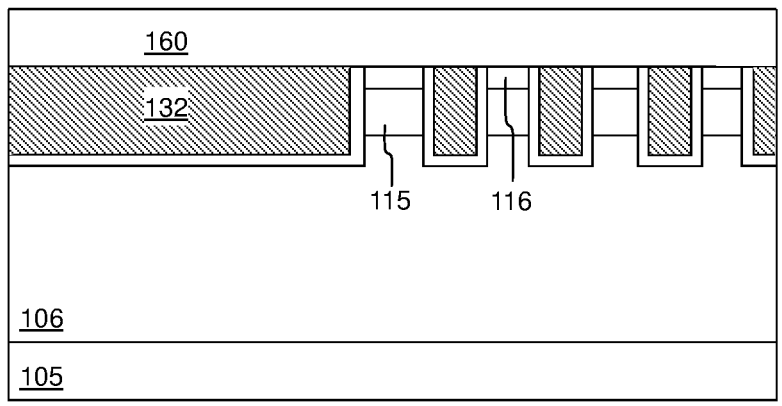

In FIG. 6F, P-type body region 115 is implanted at the top portion of the epitaxial layer 106 following by the implantation of the N+ source region 116 at the top portion of the P-type body region 115. Usually, the ion implantation is accompanied with an annealing process so that the P-type body region 115 is formed near the sidewalls of the plurality of first trenches 112a and the plurality of second trenches 112b. The N+ source region 116 can be formed on a top portion of the body region 115. Subsequently as shown in FIG. 6G, a passivation layer 160 is formed on top of the semiconductor substrate covering the source region 116 and the conductive material 132 in the plurality of first trenches 112a and the plurality of second trenches 112b.

Figure 6H:
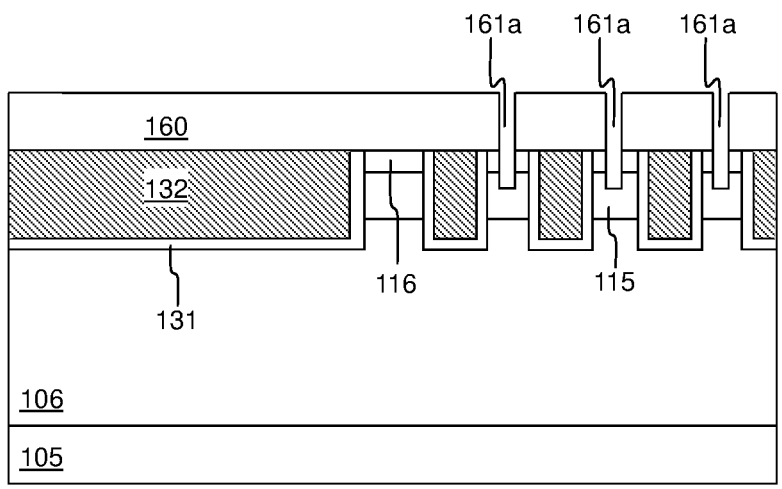
Figure 8A:
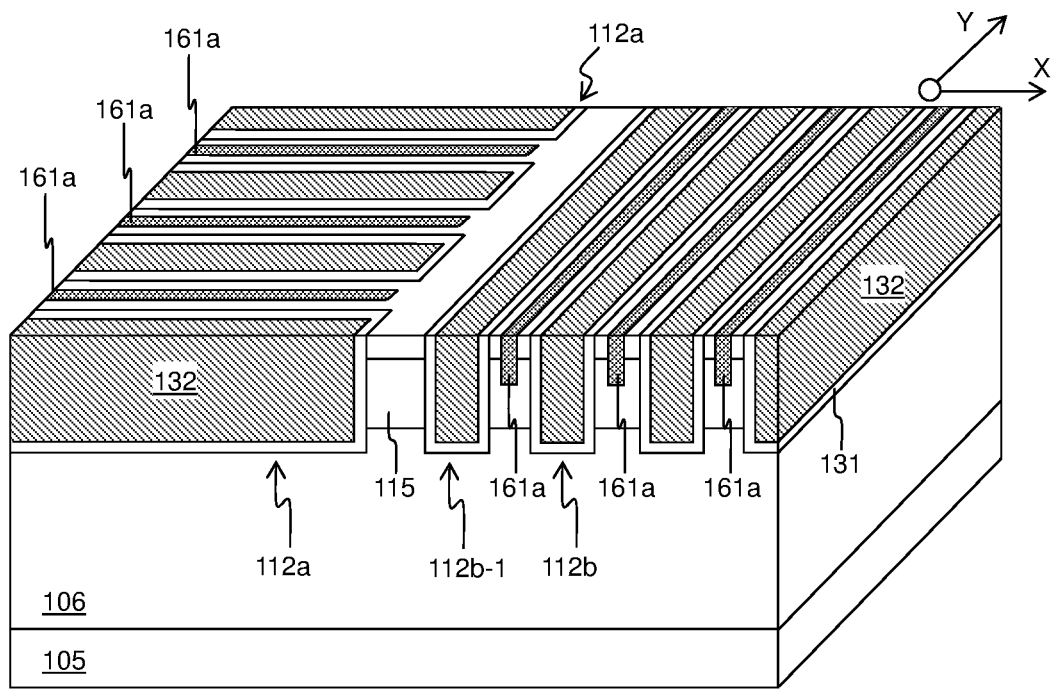
FIGS. 8A-8B are perspective views of the stripe layout trench MOSFET chip with trench metal contacts in examples of the present disclosure.

In FIG. 6H, a plurality of contact trenches 161a are formed by etching through the passivation layer 160, for example by photolithography, in the mesa structure between adjacent trenches. The plurality of contact trenches 161a are formed in both first and second directions between each set of the adjacent first trenches 112a and between each set of the adjacent second trenches 112b respectively as shown in FIG. 8A. The etching process to generate the plurality of contact trenches 161a is ended when the depth of the plurality of contact trenches 161a reaches the body region 115. The plurality of contact trenches 161a penetrate through the passivation layer 160 and the source region 116. The bottom ends of the plurality of contact trenches 161a are in the body region 115.

Figure 6I:
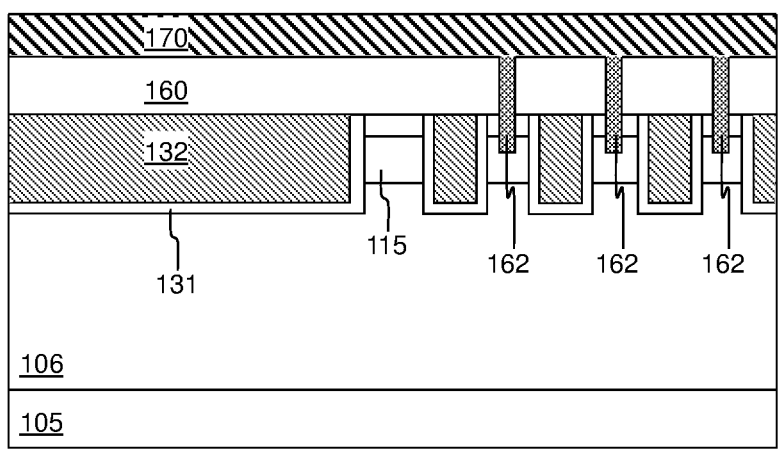

In FIG. 6I, the plurality of contact trenches 161a are filled with a metal 162 to form a plurality of metal contacts. Excessive metal material 162, for example, on top of the passivation layer 160, is etched away. The plurality of metal contacts filled with metal material 162 are electrically connected to the source region 116 and the body region 115. A metal layer 170 is formed on top of the passivation layer 160 and is patterned to form a plurality of separated metal pads. The gate contacts are created at the same time with the source/body contacts in the steps shown in FIG. 6H and FIG. 6I.

Figure 7A:
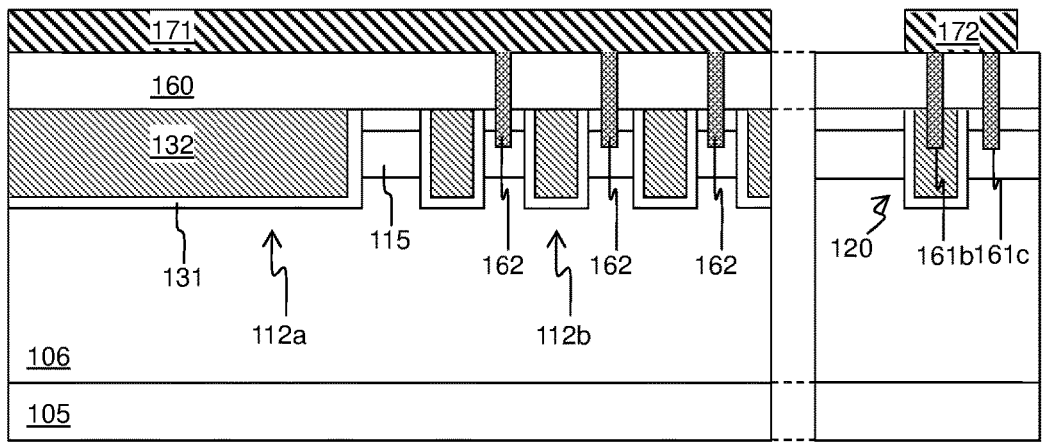
FIG. 7A is a cross-sectional view of the stripe layout single gate trench MOSFET chip with source/body metal pad and metal contacts in examples of the present disclosure.
Figure 7B:
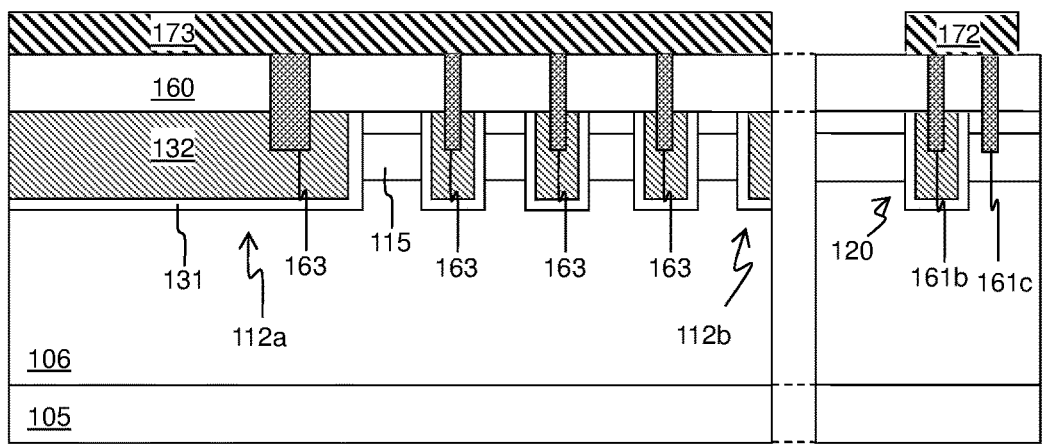
FIG. 7B is a cross-sectional view of the stripe layout single gate trench MOSFET chip with gate metal pad and metal contacts in examples of the present disclosure.

In FIG. 7B, a plurality of contact trenches 163 are formed by etching (by photolithography) through the passivation layer 160. The plurality of contact trenches 163 are aligned and in contact with the conductive material 132 filled in the pluralities of first and second trenches 112a and 112b. The contact trenches 163 are formed in both first and second directions. Then, metal 162 is filled in the plurality of contact trenches 163 to form a plurality of metal contacts. Excessive metal material 162 is etched away. The plurality of contact trenches 163 filled with metal material 162 are electrically connected to the conductive material 132. The metal layer 170 is formed on top of the passivation layer 160 and then patterned to form separated metal pads 171, 172 and 173 as shown in FIGS. 7A-7B.

As shown in FIG. 7A, the source/body metal pad 171 is electrically connected to the source region 116 and the body region 115 through the metal material 162 filled in the plurality of contact trenches 161a. As shown in FIG. 7B, the gate metal pad 173 is electrically connected to the conductive material 132 in the plurality of first trenches 112a and the plurality of second trenches 112b through the metal material 162 filled in the plurality of contact trenches 163.

Using the same process of making the pluralities of first and second trenches 112a and 112b as described in FIGS. 6A-6I, a termination trench 120 of FIG. 3B is generated by etching through the mask layer 150. Sidewalls and a bottom surface of the termination trench 120 are covered with the first insulation layer 131. The termination trench 120 is then filled with the conductive material 132. Excessive conductive material 132 is etched away. The conductive material 132 is retained in the termination trench 120 and is used as a dummy gate. With the same process of forming the plurality of contact trenches 161a of FIGS. 6H-6I, a plurality of contact trenches 161b of FIG. 7A or FIG. 7B are formed penetrating through the passivation layer 160. The plurality of contact trenches 161b are aligned and are in contact with the conductive material 132 in the termination trench 120.

Similarly, a plurality of contact trenches 161c are formed penetrating through the passivation layer 160, the floating body region 115 and floating source region 116 implanted on top portion of the semiconductor substrate near the termination trench 120 at the peripheral of the trench MOSFET chip. The pluralities of contact trenches 161b and 161c are simultaneously filled with the metal material 162. A metal pad 172 (a part of the metal layer 170) is electrically connected to the metal material 162 in the pluralities of contact trenches 161b and 161c. The conductive material 132 in the termination trench 120 is electrically connected to the floating source region 116 and the floating body region 115 at the termination area of the trench MOSFET chip and the metal layer 170.

Figure 8B:
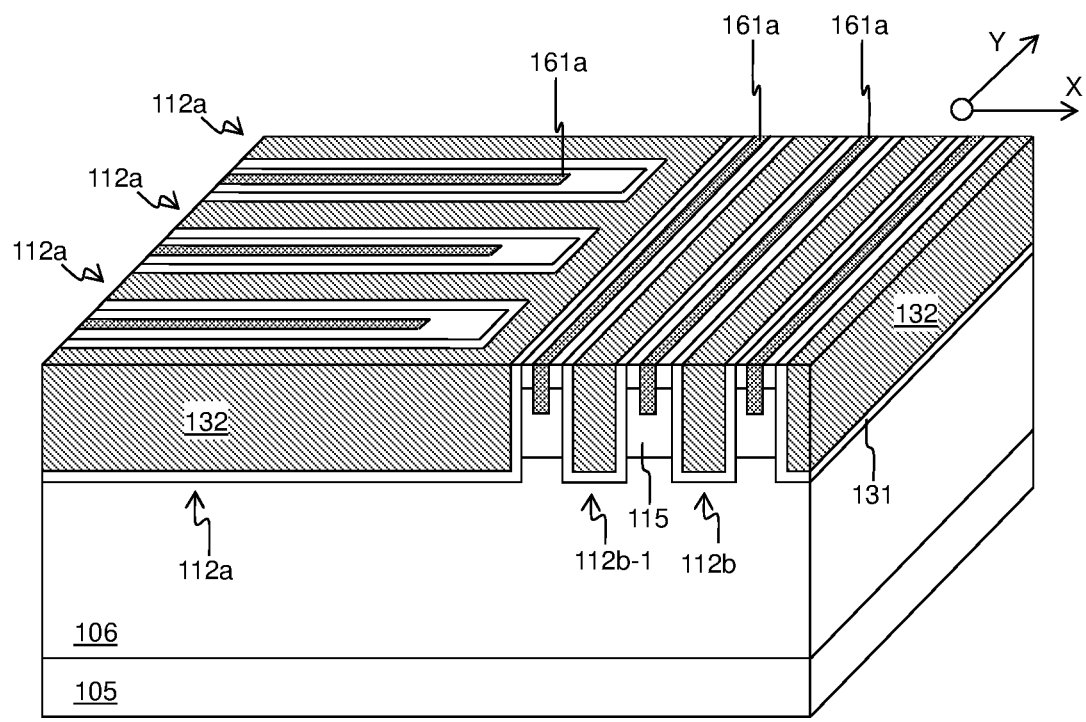

As shown in FIG. 8A, the plurality of contact trenches 161a are formed in the mesa regions between the adjacent first trenches of the plurality of first trenches 112a along the first direction (X axis) and in the mesa regions between the adjacent second trenches of the plurality of second trenches 112b along the second direction (Y axis). The plurality of contact trenches 161a are filled with the metal material 162. In the trench layout of FIG. 8A, the first trench 112a in the first preset area A is not connected with the selected second trench 112b-1 in the second preset area B closest to the first preset area A. The trench layout in FIG. 8B is similar to that in FIG. 8A excepting that a respective end of each of the plurality of first trenches 112a in the first preset area A is extended to the second preset area B. The respective end of said each of the plurality of first trenches 112a is connected to a selected second trench 112b-1 in the second preset area B closest to the first preset area A. It integrates the conductive material 132 in the plurality of first trenches 112a with the conductive material 132 in the selected second trench 112b-1. The contact trench 161a with the metal material 162 filled therein also helps to reduce the wafer warpage.

Figure 9:
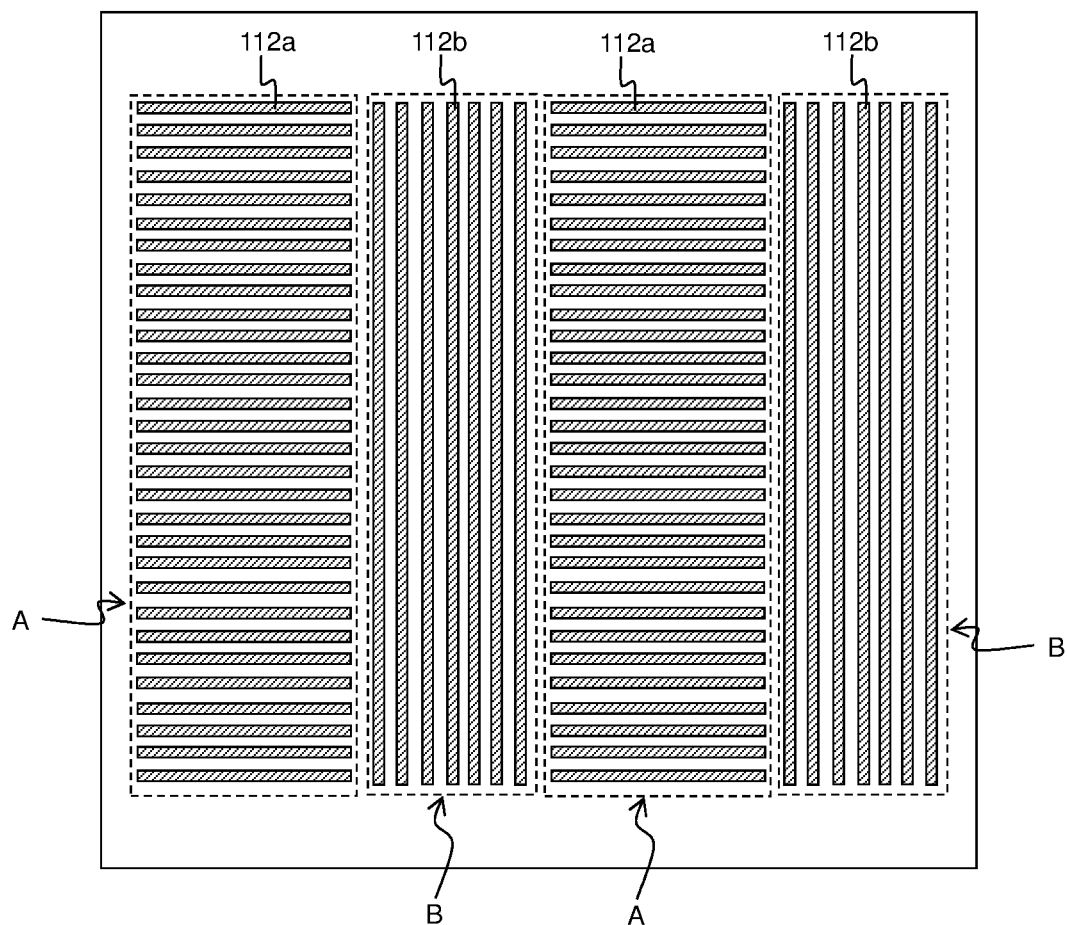
FIG. 9 is an alternative stripe layout of the first and the second trenches in a trench MOSFET chip in examples of the present disclosure.

The trench layout in FIG. 9 includes a plurality of first preset areas A and a plurality of second preset areas B. The trench layout in FIG. 3A includes one first preset area A and one second preset area B. For illustrating purpose, two first preset areas A and two second preset areas B are shown in FIG. 9. In one example, the two first preset areas A and the two second preset areas B shown in FIG. 9 are arranged in the same pattern as the first preset area A and the second preset area B in FIG. 3A.

Figure 10A:
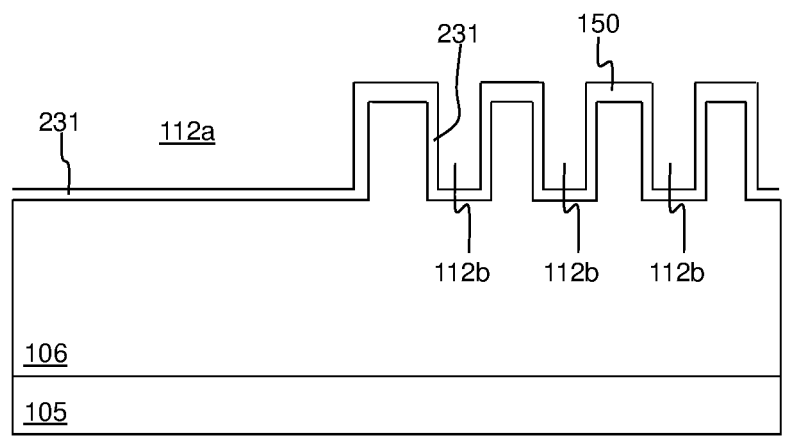
FIGS. 10A-10F are cross-sectional views showing a preparation method for a stripe layout trench MOSFET chip with shield gate in examples of the present disclosure.

FIGS. 6A-6I show a preparation process for single gate trench MOSFET. FIGS. 10A-10G, which is similar to the process in FIGS. 6A-6D, illustrates the preparation process for shield gate trench MOSFET chip. The bottom shield gate helps to reduce the wafer warpage. As shown in FIG. 10A, the plurality of first trenches 112a and the plurality of second trenches 112*b* are formed in the semiconductor substrate. The first insulation layer 231 is then formed on internal walls and bottom surfaces of the plurality of first trenches 112*a* and the plurality of second trenches 112*b*.

Figure 10B:
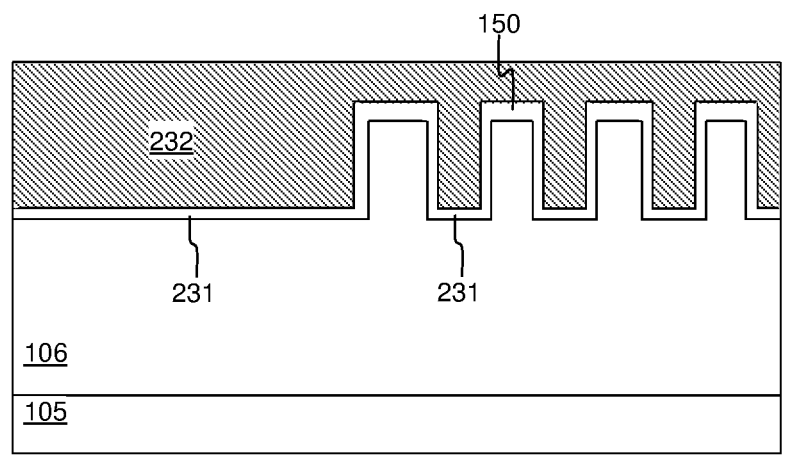
Figure 10C:
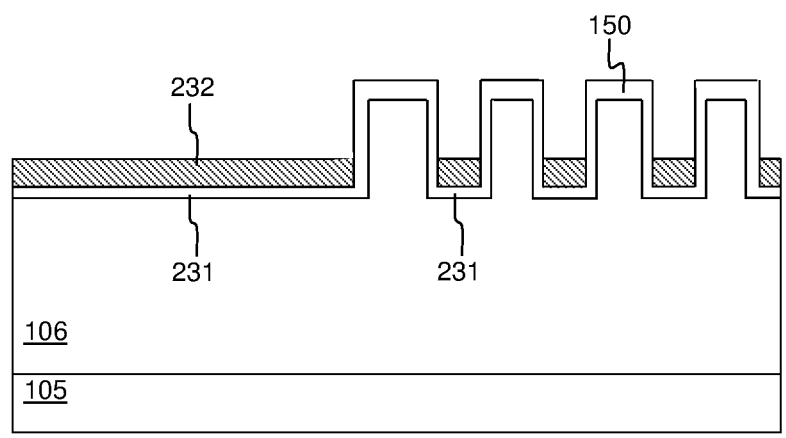

In FIG. 10B, the conductive material 232 is deposited. The conductive material 232 covers a top profile of the semiconductor substrate and the mask layer 150. The plurality of first trenches 112*a* and the plurality of second trenches 112*b* are filled with the conductive material 232. Excessive conductive material 232 are etched away. For example, a dry etch process is applied to remove the excessive conductive material 232 on the top profile of the semiconductor substrate and the mask layer 150. Excessive conductive material 232 on the top portion of the plurality of first trenches 112*a* and the plurality of second trenches 112*b* are also removed. Only a portion of the conductive material 232 is retained in the bottom portion of the plurality of first trenches 112*a* and the plurality of second trenches 112*b* as shown in FIG. 10C. The retained conductive material 232 functions as the shield gate of the trench MOSFET.

Figure 10D:
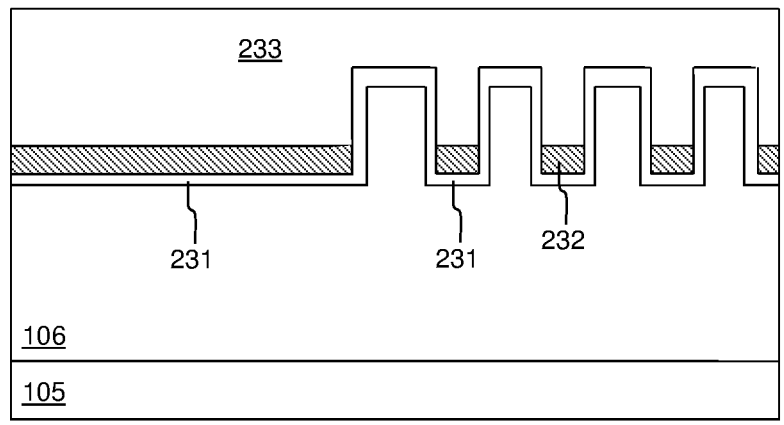
Figure 10E:
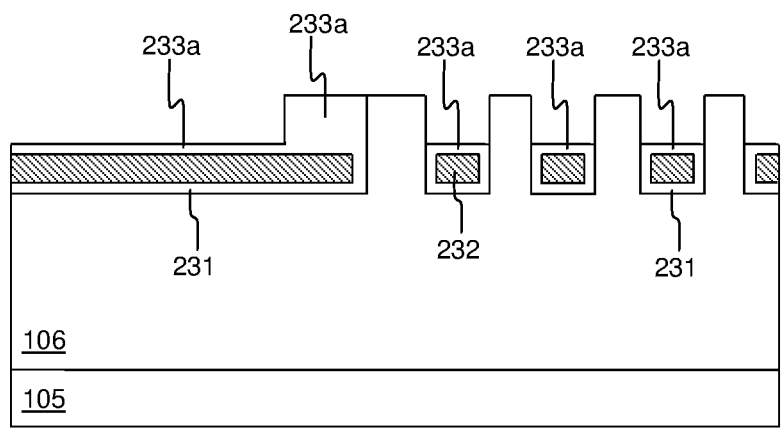

In FIG. 10D, a layer of insulation material 233, for example an oxide layer, is deposited atop of the semiconductor substrate. The layer of insulation material 233 covers the mask layer 150. The plurality of first trenches 112*a* and the plurality of second trenches 112*b* above the conductive material 232 are filled with the insulation material 233. As shown in FIG. 10E, an etching process is applied to the insulation material 233 to remove the insulation material 233 on top of the mask layer 150 and to remove the insulation material 233 filled in the top portions of the plurality of first trenches 112*a* and the plurality of second trenches 112*b* so as to form a thin insulation interlayer 233*a* atop the conductive material 232. The mask layer 150 is then removed. Sidewalls on top portions of the plurality of first trenches 112*a* and the plurality of second trenches 112*b* and the surface of the epitaxial layer 106 at the mesa regions between two trenches are exposed.

Figure 10F:
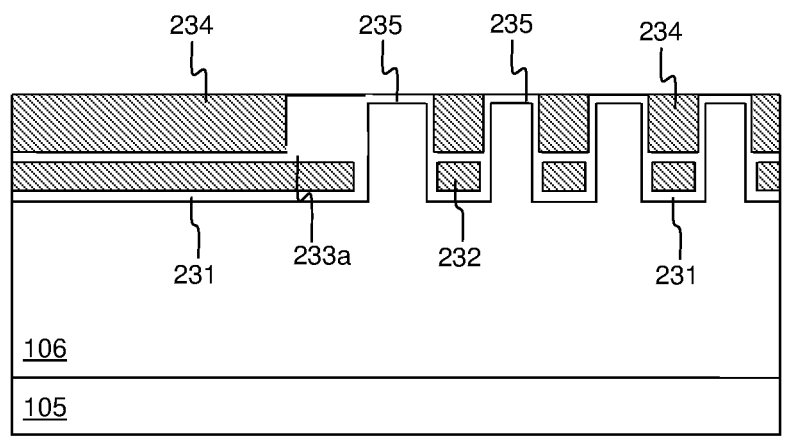

As shown in FIG. 10F, a second insulation layer 235, such as an oxide layer, is grown on the exposed surface of the epitaxial layer 106 and on the top portions of the plurality of first trenches 112*a* and the plurality of second trenches 112*b*. A conductive material 234 is deposited on the semiconductor substrate and the second insulation layer 235. The top portions of the plurality of first trenches 112*a* and the plurality of second trenches 112*b* are filled with the conductive material 234. Excessive conductive material 234 is removed. For example, a dry etching process is applied to the conductive material 234. Only portions of the conductive material 234 on top portions of the plurality of first trenches 112*a* and the plurality of second trenches 112*b* are retained. The retained conductive material 234 functions as the control gate of the MOSFET. The control gate (conductive material 234) and the shield gate (conductive material 232) in the plurality of first trenches 112*a* and the plurality of second trenches 112*b* are isolated by the insulation interlayer 233*a*.

Figure 10G:
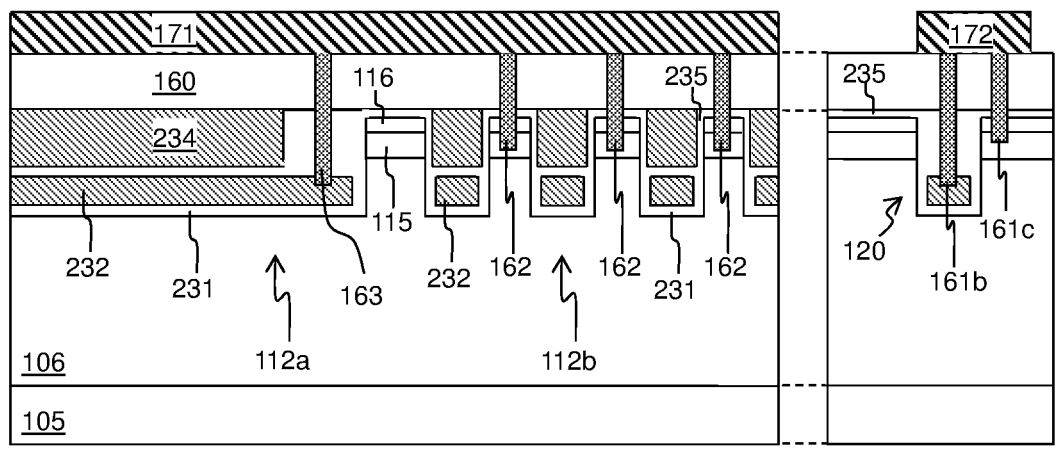
FIG. 10G is a cross-sectional view of the stripe layout shield gate trench MOSFET chip with source/body metal pad and metal contacts in examples of the present disclosure.
Figure 10H:
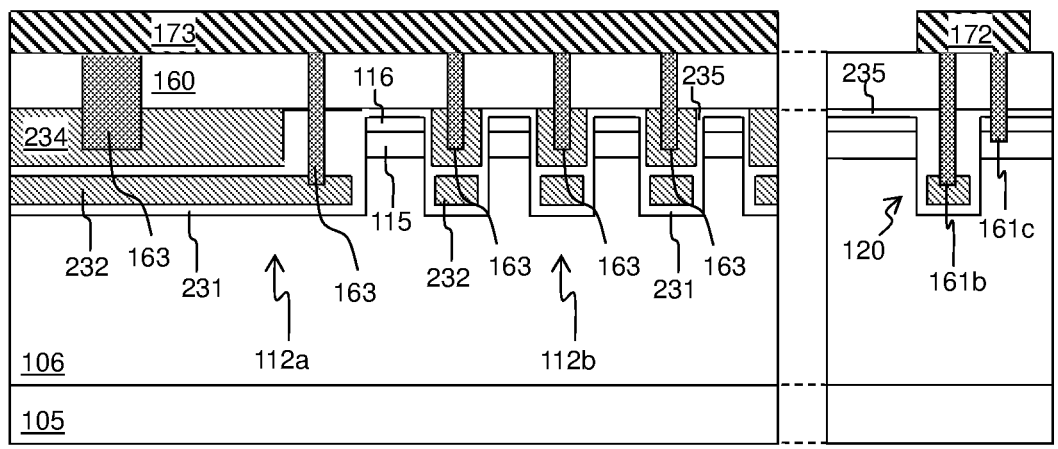
FIG. 10H is a cross-sectional view of the stripe layout shield gate trench MOSFET chip with gate metal pad and metal contacts in examples of the present disclosure.

The steps after the step associated with FIG. 10F are similar to the steps associated with FIG. 6F to FIG. 6I. The fabricated MOSFET device structures is shown in FIG. 10G and FIG. 10H. Each trench includes a control gate and a shield gate located under the control gate. FIG. 10G and FIG. 10H are similar to FIG. 7A and FIG. 7B respectively. FIG. 10G is a cross-sectional view of the shield gate trench MOSFET with the source/body metal pad 171 that is electrically connected to the source region 116 and the body region 115 through the metal material 162 filled in the plurality of contact trenches 161*a*. FIG. 10H is a cross-sectional view of the shield gate trench MOSFET with the gate metal pad 173 that is electrically connected to the conductive material 132 in the plurality of first trenches 112*a* and the plurality of second trenches 112*b* through the metal material 162 filled in the plurality of contact trenches 163.

In one example, for the shield gate trench MOSFET, one end of one or a plurality of first trenches 112*a* in the first preset area A is extended and is connected to a selected second trench 112*b*-1 in the second preset area B closest to the first preset area A (not shown). It is similar to the structure shown in the FIG. 8B.

Figure 11:
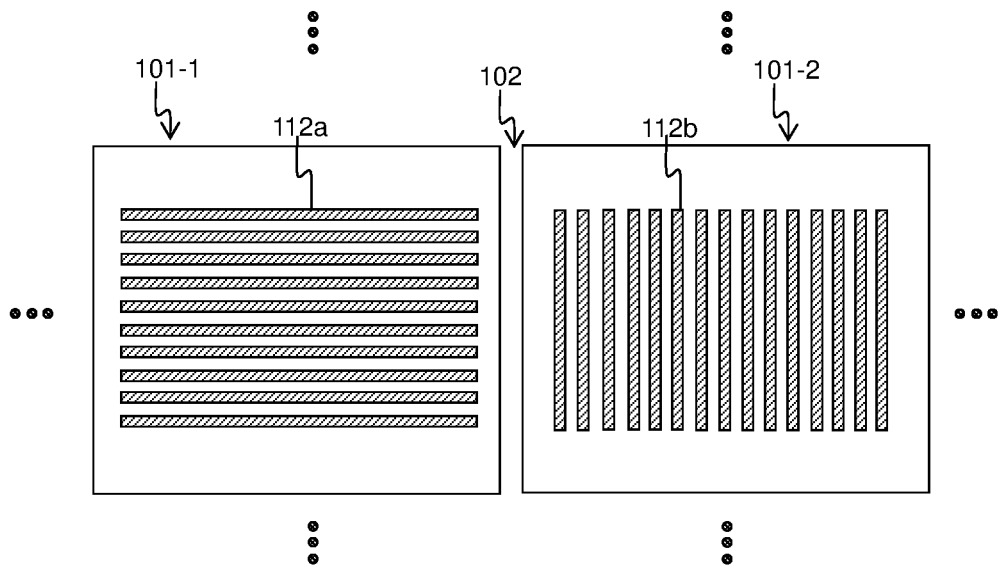
FIG. 11 is a top view showing an alternative stripe layout for two adjacent trench MOSFET chips on a wafer in examples of the present disclosure.

As shown in FIG. 11, a plurality of first trenches 112*a* arranged side by side in a first trench MOSFET chip 101-1 on the wafer 100 with stripe layout extending along a first direction. A plurality of second trenches 112*b* arranged side by side in a second trench MOFSET chip 101-2 on the wafer 100 with the stripe layout extending along a second direction. Each of the plurality of first trenches 112*a* and the plurality of second trenches 112*b* forms a shield gate trench MOSFET. The first direction is perpendicular to the second direction. In examples of the present disclosure, the first direction is parallel to the transverse scribe line and the second direction is parallel to the vertical scribe line on the wafer. Each of the MOSFET chip 101-1 and the MOSFET chip 101-2 only includes trenches extending along one direction. A mask layer for etching trenches is easily made. On one example, two MOSFET chips 101-1 and 101-2 are adjacent to each other. In another example, two MOSFET chips 101-1 and 101-2 are not adjacent to each other. When two MOSFET chips 101-1 and 101-2 are arranged adjacent to each other, the wafer stresses between them is reduced. It is advantageous to eliminate a portion of stress on the wafer.

Figure 12:
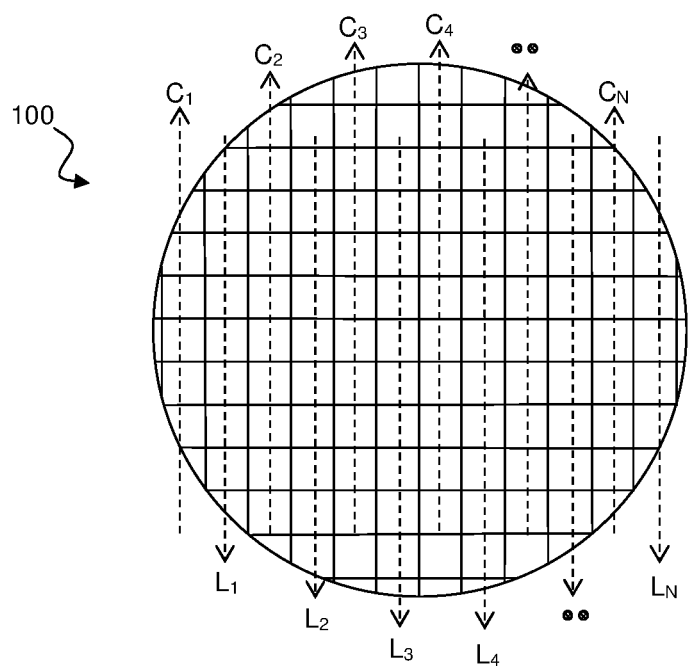
FIG. 12 is a top view showing stripe layout trench MOSFET chips arranged on different columns on a wafer in examples of the present disclosure.

In FIG. 12, the trench MOSFET chips on the wafer 100 are arranged in an array including a first plurality of columns of the first MOSFET chips ($C_1, C_2, C_3, \ldots C_N$) and a second plurality of columns of the second MOSFET chips ($L_1, L_2, L_3, \ldots L_N$). The array is arranged in an alternating interval pattern. For example, a column of the second MOSFET chips is arranged in between two columns of the first MOSFET chips. A column of the first MOSFET chips is arranged in between two columns of the second MOSFET chips. The stripe layout of the first trench MOSFET chips in the columns ($C_1, C_2, C_3, \ldots C_N$) extend along a first direction. The stripe layout of the second trench MOSFET chips in columns ($L_1, L_2, L_3, L_N$) extend along a second direction. It is applied to reduce the stress on the wafer.

Those of ordinary skill in the art may recognize that modifications of the embodiments disclosed herein are possible. For example, the alternating interval pattern of FIG. 12 may vary. Other modifications may occur to those of ordinary skill in this art, and all such modifications are deemed to fall within the purview of the present invention, as defined by the claims.

The invention claimed is:

1. A trench metal-oxide-semiconductor field-effect transistor (MOSFET) device comprising:
   a semiconductor substrate of a first conductivity type;
   a plurality of first trenches arranged side by side in a first stripe layout in a first preset area of the semiconductor substrate, the plurality of first trenches extending along a first direction; and
   a plurality of second trenches arranged side by side in a second stripe layout in a second preset area of the semiconductor substrate, the plurality of second trenches extending along a second direction perpendicular to the first direction;

wherein a respective control gate is located in each of the plurality of first trenches and the plurality of second trenches;

a body region of a second conductivity type is formed on a top portion of the semiconductor substrate near sidewalls of the plurality of first trenches and the plurality of second trenches; and a source region of the first conductivity type is formed on a top portion of the body region;

wherein a first portion of the source region is along sidewalls of the plurality of first trenches and a second portion of the source region is along sidewalls of the plurality of second trenches.

2. The trench MOSFET device of claim 1, wherein the trench MOSFET device is a square chip; the first direction is parallel to a pair of opposite sides of the square chip;

and the second direction is parallel to another pair of opposite sides of the square chip.

3. The trench MOSFET device of claim 1, wherein an end of at least one selected first trench of the plurality of first trenches is directly connected to a selected second trench of the plurality of second trenches; and wherein a length of the selected second trench is equal to a length of an adjacent trench of the selected second trench of the plurality of second trenches.

4. The trench MOSFET device of claim 1, wherein contact trenches are formed in mesa regions between adjacent first trenches of the plurality of first trenches and between adjacent second trenches of the plurality of second trenches; and wherein the contact trenches are filled with a metal material.

5. The trench MOSFET device of claim 1, wherein the first preset area excludes the plurality of second trenches and the second preset area excludes the plurality of first trenches.

6. The trench MOSFET device of claim 1, wherein each of the plurality of first trenches and the plurality of second trenches comprises a respective control gate located at a top portion of the trench MOSFET device and a respective shield gate located at a bottom portion of the trench MOSFET device; and wherein the respective control gate and the respective shield gate is isolated by a respective insulation interlayer.

7. The trench MOSFET device of claim 1, wherein an end of at least one selected first trench of the plurality of first trenches is connected to a selected second trench of the plurality of second trenches and wherein a selected control gate located in the at least one selected first trench of the plurality of first trenches is directly connected to another selected control gate located in the selected second trench of the plurality of second trenches.

8. A trench metal-oxide-semiconductor field-effect transistor (MOSFET) strip layout wafer comprises a plurality of first trenches arranged side by side with a first stripe layout extending along a first direction in a first portion of a first MOSFET chip on the trench MOSFET strip layout wafer; and a plurality of second trenches arranged side by side with a second stripe layout extending along a second direction in a second portion of a second MOSFET chip on the trench MOSFET strip layout wafer;

wherein the first direction is perpendicular to the second direction;

wherein a semiconductor substrate of the first MOSFET chip is of a first conductivity type;

wherein a body region of the first MOSFET chip is of a second conductivity type and the body region is formed on a top portion of the semiconductor substrate; and wherein a source region of the first MOSFET chip is of the first conductivity type and the source region is formed on a top portion of the body region;

wherein a first portion of the source region is along sidewalls of the plurality of first trenches and a second portion of the source region is along sidewalls of the plurality of second trenches.

9. The trench MOSFET strip layout wafer of claim 8, wherein a first selected MOSFET chip of two adjacent MOSFET chips on the trench MOSFET strip layout wafer has trenches extending along the first direction; and wherein a second selected MOSFET chip of the two adjacent MOSFET chips on the trench MOSFET strip layout wafer has trenches extending along the second direction.

10. The trench MOSFET stripe layout wafer of claim 8, wherein a plurality of MOSFET chips are arranged on the trench MOSFET stripe layout wafer in an array comprising columns formed by a first plurality of MOSFET chips arranged alternately with columns formed by a second plurality of MOSFET chips; wherein the first plurality of MOSFET chips comprise the trench MOSFET stripe layout extends along the first direction and the second plurality of MOSFET chips comprise the trench MOSFET stripe layout extends along the second direction.

11. The trench MOSFET stripe layout wafer of claim 8, wherein a respective control gate is located in each of the plurality of first trenches and the plurality of second trenches.

12. A trench metal-oxide-semiconductor field-effect transistor (MOSFET) device comprising:

a semiconductor substrate of a first conductivity type;

a plurality of first trenches arranged side by side in a first stripe layout in a first preset area of the semiconductor substrate, the plurality of first trenches extending along a first direction; and a plurality of second trenches arranged side by side in a second stripe layout in a second preset area of the semiconductor substrate, the plurality of second trenches extending along a second direction perpendicular to the first direction;

wherein a respective control gate is located in each of the plurality of first trenches and the plurality of second trenches;

a body region of a second conductivity type is formed on a top portion of the semiconductor substrate near sidewalls of the plurality of first trenches and the plurality of second trenches; and a source region of the first conductivity type is formed on a top portion of the body region; wherein a first portion of the source region is along sidewalls of the plurality of first trenches and a second portion of the source region is along sidewalls of the plurality of second trenches; and wherein a top metal layer disposed atop the trench MOSFET device contacts mesa regions between adjacent first trenches of the plurality of first trenches and between adjacent second trenches of the plurality of second trenches.

13. The trench MOSFET device of claim 12, wherein the trench MOSFET device is a square chip; the first direction is parallel to a pair of opposite sides of the square chip; and the second direction is parallel to another pair of opposite sides of the square chip.

14. The trench MOSFET device of claim 12, wherein an end of at least one selected first trench of the plurality of first trenches is directly connected to a selected second trench of the plurality of second trenches;

wherein a length of the selected second trench is equal to a length of an adjacent trench of the selected second trench of the plurality of second trenches.

15. The trench MOSFET device of claim 12, wherein contact trenches are formed in mesa regions between adjacent first trenches of the plurality of first trenches and between adjacent second trenches of the plurality of second trenches; and wherein the contact trenches are filled with a metal material.

16. The trench MOSFET device of claim 12, wherein the first preset area excludes the plurality of second trenches and the second preset area excludes the plurality of first trenches.

17. The trench MOSFET device of claim 12, wherein each of the plurality of first trenches and the plurality of second trenches comprises a respective control gate located at a top portion of the trench MOSFET device and a respective shield gate located at a bottom portion of the trench MOSFET device; and wherein the respective control gate and the respective shield gate is isolated by a respective insulation interlayer.

18. The trench MOSFET device of claim 12, wherein an end of at least one selected first trench of the plurality of first trenches is connected to a selected second trench of the plurality of second trenches and wherein a selected control gate located in the at least one selected first trench of the plurality of first trenches is directly connected to another selected control gate located in the selected second trench of the plurality of second trenches.

* * * * *